United States Patent [19]

Hjelm et al.

[11] Patent Number: 5,036,292
[45] Date of Patent: Jul. 30, 1991

[54] DECOUPLED ELECTROLYTIC CAPACITOR

[75] Inventors: John R. Hjelm, Minneapolis; Richard D. Larson, Eden Prairie, both of Minn.

[73] Assignee: Audio Research Corporation, Minneapolis, Minn.

[21] Appl. No.: 480,726

[22] Filed: Feb. 16, 1990

[51] Int. Cl.[5] .............................................. H03F 3/181
[52] U.S. Cl. .................................... 330/202; 330/297; 333/181
[58] Field of Search ............... 330/202, 297, 306, 178, 330/179; 333/167, 181; 381/120, 121

[56] References Cited

U.S. PATENT DOCUMENTS

| 2,759,051 | 8/1956 | Lockwood et al. | 179/171 |
|---|---|---|---|
| 3,290,578 | 12/1966 | Ainsworth | 321/9 |
| 3,746,963 | 6/1973 | VeNard, II | 321/2 |
| 4,232,272 | 11/1980 | Fabri | 330/294 |
| 4,639,663 | 1/1987 | Ueno et al. | 323/356 |
| 4,764,736 | 8/1988 | Usui et al. | 330/294 |

FOREIGN PATENT DOCUMENTS

| 1563054 | 2/1970 | Fed. Rep. of Germany | 333/181 |
|---|---|---|---|
| 306253 | 2/1929 | United Kingdom | 330/178 |

OTHER PUBLICATIONS

"The Sonic Importance of Passive Parts", pp. 1–13, Pub. Sep. 1981, *International Audio Review Hotline*, #13.

"Unregulated Power Supplies and Power Amplifiers", pp. 194–210, No. 1 & 2, pub. Jul. 1976, *International Audio Review*.

"Picking Capacitors", by W. G. Jung & R. Marsh, pp. 52–62, Pub. Feb. 1980, *Audio*.

*Primary Examiner*—James B. Mullins
*Attorney, Agent, or Firm*—Merchant, Gould, Smith, Edell, Welter and Schmidt

[57] ABSTRACT

A filter capacitor network includes an inductor connected in series with an aluminum electrolytic capacitor with the inductor and aluminum electrolytic capacitor bypassed with a capacitor having relatively better high frequency performance characteristics than the aluminum electrolytic capacitor. The inductor decouples the aluminum capacitor from the network at middle and upper frequencies so that the bypass capacitor dominates the characteristics of the network in that range. A signal coupling/DC blocking capacitor network of the same configuration is also disclosed. An amplifier design includes the filter network in the power supply. The filter network is also disclosed in an audio signal path for use in signal coupling/DC blocking.

6 Claims, 2 Drawing Sheets

DECOUPLED ELECTROLYTIC CAPACITOR

TECHNICAL FIELD OF THE INVENTION

The present invention pertains generally to the field of audio amplification, and more particularly to capacitive network designs in audio amplifiers.

BACKGROUND OF THE INVENTION

It has been known for some time that the use and design of passive circuit elements in high quality audio amplifiers has been overlooked as a result of a preoccupation with active circuitry design. (See, for example, IAR Hotline, No. 13, September 1981, "The Sonic Importance of Passive Parts", by J. Peter Moncrieff, published by IAR, 2449 Dwight Way, Berkeley, California 94704). As a result, in many designs the benefits of improved active circuitry are not fully attained due to imperfections and distortions introduced by improper or less than optimized passive component designs. Accordingly, increasing attention has been turned to the design and use of passive elements in high quality audio amplifier designs. The present invention pertains to capacitive networks and the design of power supplies and passive signal paths in audio amplifiers.

The large energy storage requirement for power supplies in audio amplifiers makes aluminum electrolytic capacitors highly desirable as filter capacitors. A filter capacitor smooths the rectified AC voltage, stores electrical energy, and bypasses unwanted frequencies. Electrolytic capacitors, however, have more inherent inductance and other imperfections than most other types of capacitors, resulting in poor response, particularly at higher frequencies. The relatively high inherent inductance of an aluminum electrolytic capacitor limits its ability to bypass and promptly deliver fast transients of power to the audio amplifier at higher frequencies. Their other imperfections—namely, resistive losses; variation with aging, temperature, voltage, and frequency; and non-linearities due to dielectric absorption factors—introduce signal distortion which degrades the quality of sound in audio amplifier applications. These limitations are usually remedied by bypassing the electrolytic capacitor with a smaller film or tantalum capacitor that has fewer imperfections and better characteristics at higher frequencies. However, the electrolytic capacitor nonetheless negatively affects the response characteristics of the network such that its performance at higher frequencies is less optimal than it would be if the electrolytic capacitor was absent.

Aluminum electrolytic capacitors are sometimes desirable in audio amplifier signal coupling/DC blocking applications where high capacitance is required. Again, however, the poor response characteristics of electrolytic capacitors at the higher frequencies usually requires that they be used in conjunction with a smaller bypass capacitor; and, again, less than optimal performance at higher frequencies is attained due to degradation introduced by the electrolytic capacitor.

SUMMARY OF THE INVENTION

According to one aspect of the invention there is provided a capacitor network for use in audio applications. The network comprises an inductor, an aluminum electrolytic capacitor connected in series with the inductor, and a smaller bypass capacitor connected to bypass the inductor and the aluminum electrolytic capacitor. The inductor is chosen to have an inductance which substantially decouples the aluminum electrolytic capacitor from the network above a selected frequency so that the bypass capacitor dominates the characteristics of the network above the selected frequency. The network thus provides that non-linearities and distortions introduced by the aluminum electrolytic capacitor are minimized in the performance of the network above the selected frequency.

According to another aspect of the invention, there is provided an audio amplifier including a power supply utilizing the capacitive network as a filter capacitor network.

According to still another aspect of the invention, there is provided an audio amplifier wherein the capacitive network is used in a signal coupling path in the amplifier.

DETAILED DESCRIPTION OF THE INVENTION

Figure 1:
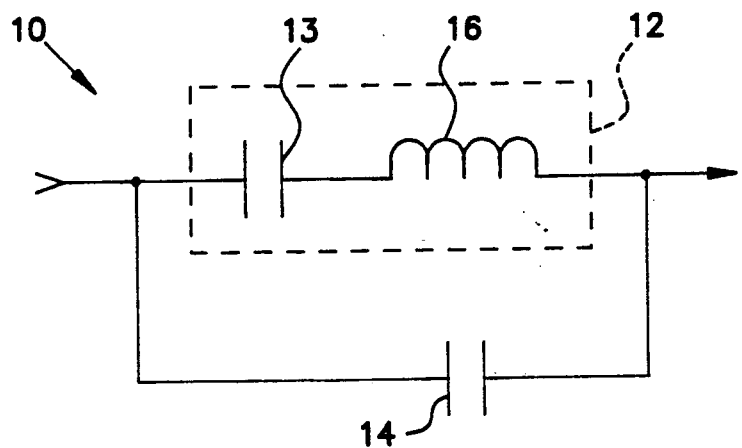
FIG. 1 is a simplified schematic diagram of a prior art capacitive network including an electrolytic capacitor and bypass capacitor.

Referring now to FIG. 1, there is shown a conventional, prior art capacitor network 10 including a large aluminum electrolytic capacitor 12 and a small film or tantalum bypass capacitor 14 connected in parallel therewith. Capacitor 12 has a capacitive element 13 and an inherent inductance 16. As noted hereinabove, inductance 16 degrades the frequency response of capacitor 12, while its other imperfections introduce additional signal distortion.

Tantalum or film bypass capacitor 14, having a much better characteristics and response at high frequencies improves the response of network 10 by allowing a better optimized path for middle and high frequency signals through the network. Nonetheless, aluminum electrolytic capacitor 12 negatively affects the performance characteristics of the network at all but the highest frequencies of concern in audio applications (above 20 KHz), where the inherent inductance 16 is typically great enough to substantially "choke" off and decouple capacitor 12 from the network. As a result, the more optimal performance characteristics of bypass capacitor 14 are not fully realized.

Figure 2:
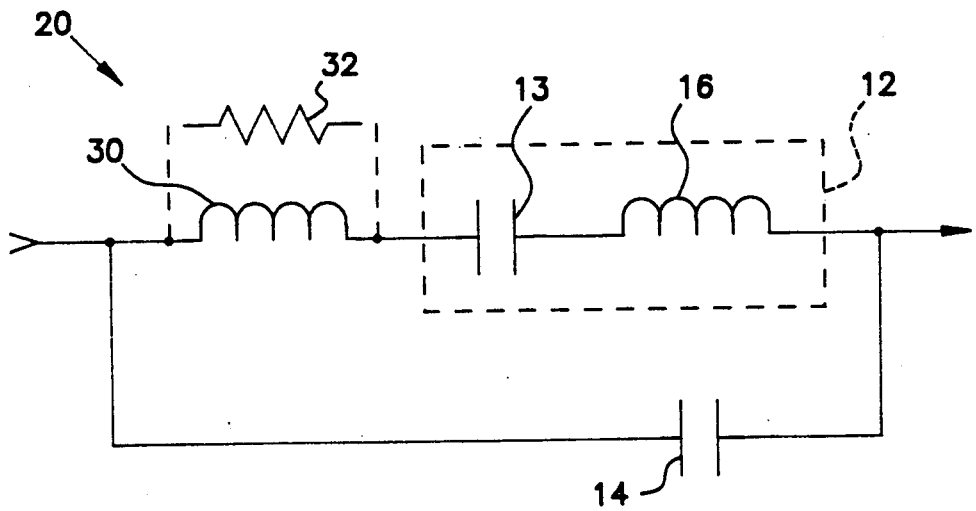
FIG. 2 is a schematic diagram of a capacitive network including an electrolytic capacitor and a bypass capacitor according to the present invention.

Referring now to FIG. 2, there is shown the improved network 20 according to the present invention. Network 20 includes, in addition to electrolytic capacitor 12 and smaller bypass capacitor 14, an inductor 30 in series with electrolytic capacitor 12. The value of inductor 30 is chosen so as to substantially "choke" off and decouple capacitor 12 from the network 20 above a certain, selected transition frequency in the mid-range, preferably at the point where its performance begins to degrade significantly. The bypass capacitor 14 thus dominates the response characteristics of network 20 above the selected transition frequency while capacitor 12 remains active in the network at the low frequencies where it is most needed to store large amounts of energy. The overall performance characteristics of the network are, therefore, improved over that of network 10. Moreover, the need to compensate for the imperfections in the electrolytic capacitor above the selected transition frequency is reduced; allowing for simpler network designs.

A resistance 32 is optionally included in parallel with the inductor 30 in order to minimize resonance effects in the network. The specific values of inductance and resistance of inductor 30 and resistor 32 are chosen to minimize resonance effects in the network, overall signal distortion, and to match the specific capacitors in the circuit application. Typical values for network 20 are 100 UF for capacitive element 13, 5 UH for inductor 30, 100 ohms for resistor 32, 2 UF for bypass capacitor 14, and a transition frequency of 5-7 KHz.

Figure 3:
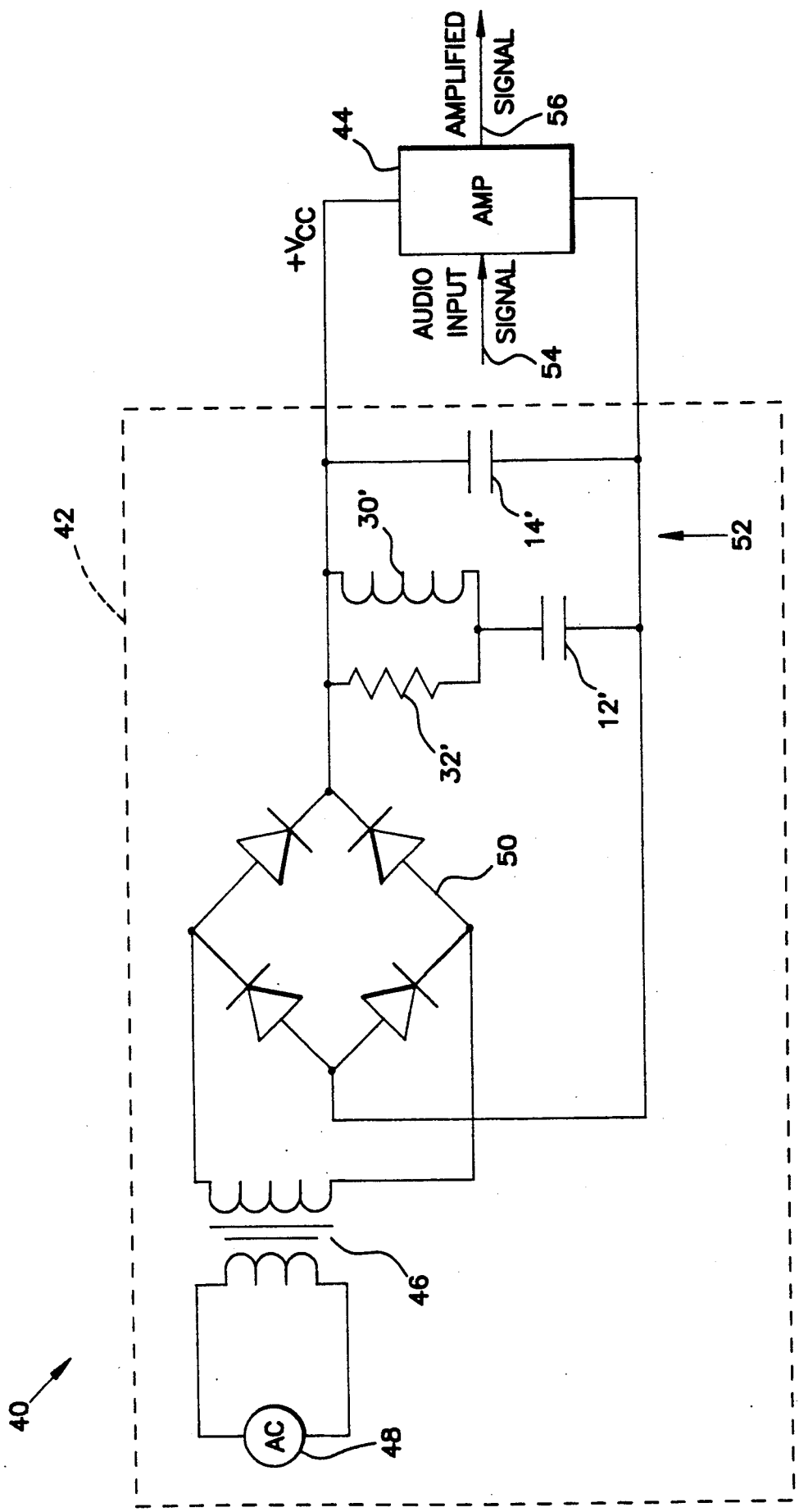
FIG. 3 is a schematic diagram of an audio amplifier including a power supply utilizing the capacitive network of FIG. 2 according to the present invention.

In FIG. 3 there is shown an improved audio amplifier design according to the present invention. Design 40 includes a power supply section 42 and an amplifier circuit 44. Power supply 42 includes a transformer 46 receiving an AC line voltage 48. Transformer 46 steps up this AC line voltage and applies it to rectifier circuit 50. The rectified voltage output of rectifier circuit 50 is applied to filter capacitor network 52. Network 52 comprises inductor 30', resistor 32', aluminum electrolytic capacitor 12' and a smaller bypass capacitor 14', configured in the same manner as network 20 of FIG. 2. The output of network 52 comprises a filtered DC voltage (+VCC), which is applied to the power input of amplifier circuit 44. Amplifier circuit 44 amplifies audio input signal 54 to provide amplified signal 56.

Network 52 thus provides that electrolytic capacitor 12' and bypass capacitor 14' smooth the output of rectifier 50, provide energy storage, and bypass unwanted AC signals. Aluminum electrolytic capacitor 12' bypasses unwanted low frequency signals and meets the transient power demands of amplifier 44 required to amplify low frequency audio signals. The bypass capacitor 14' bypasses middle and high frequencies and delivers fast transients of power to amplifier 44 as required for amplification of middle and upper audio frequencies. The network 52 thus minimizes the leakage of unwanted AC ripple into the amplifier 44 and provides for optimized delivery of energy to the amplifier across the audio frequency spectrum.

Figure 4:
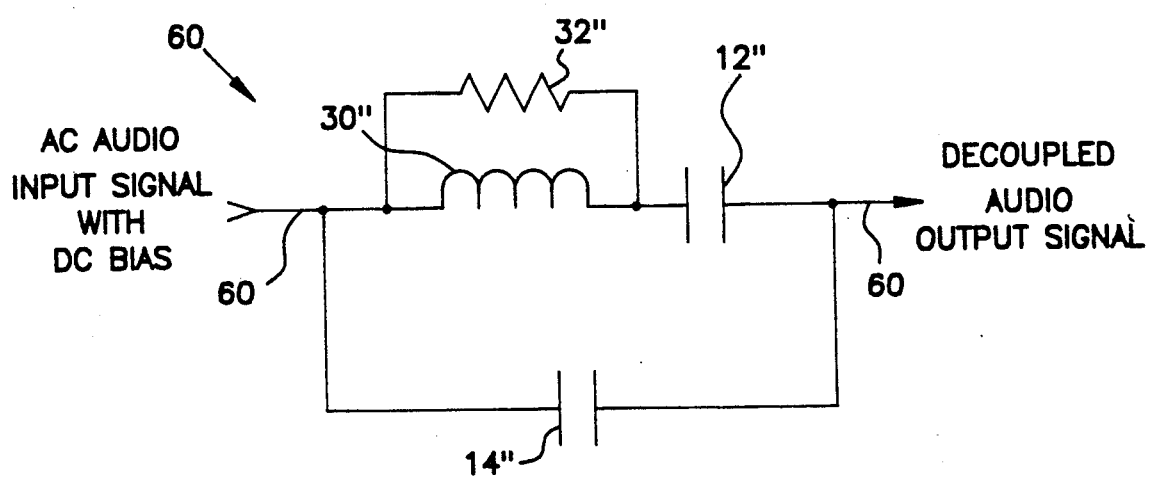
FIG. 4 is a schematic diagram of an audio amplifier signal path utilizing the capacitive network of FIG. 2 according to the present invention.

Referring now to FIG. 4, there is shown an improved AC signal coupling/DC blocking network 60 for an audio amplifier, according to the present invention. Network 60 receives an AC audio input signal with a DC bias on line 62 and outputs a DC decoupled audio output signal on line 64. Network 60 provides that aluminum electrolytic capacitor 12' can be used to pass low frequency signals, with the smaller bypass capacitor 14' providing for the passage of middle and high frequency AC signals. As in networks 20 and 52, inductor 30" serves to decouple the electrolytic capacitor 12 from the network 60 in the middle and upper frequencies.

Accordingly, there has been described an improved capacitive network utilizing an aluminum electrolytic capacitor and corresponding improved audio amplifier designs. The improved capacitor network of the present invention is not limited to application to aluminum electrolytic capacitors, but may be applied to other types of imperfect capacitors, or applied in multiple "chain" networks a progressively smaller capacitors. Although the invention has been described herein in its preferred form, those of skill in the art will recognize that many modifications and changes may be made thereto without departing from the spirit and scope of the invention as set forth in the claim appended hereto.

We claim:

1. An audio amplifier, comprising:

transformer and rectifier means receiving an AC input power signal and providing a rectified output voltage;

a capacitor network receiving said rectified voltage to provide a DC output signal, said network including an aluminum electrolytic capacitor connected in series with an inductor, said aluminum electrolytic capacitor having a relatively high capacitance and an inherent inductance which degrades its response above a certain frequency, said network further including a bypass capacitor connected to bypass said inductor and said electrolytic capacitor, said bypass capacitor having a relatively small capacitance compared to said electrolytic capacitor and relatively less inherent inductance to provide better high frequency response, said inductor having an inductance which substantially decouples said electrolytic capacitor from said network above a selected frequency so that said bypass capacitor dominates the characteristics of said network above said selected frequency;

amplifier circuit means for receiving an audio input signal and amplifying said signal to provide an amplified audio output signal; and means for connecting said DC power signal to said amplifier circuit means to provide power thereto.

2. Apparatus according to claim 1 further including a resistor connected in parallel with said inductor, the value of said resistor chosen to minimize resonant effects in said network.

3. An audio amplifier signal path for coupling an audio signal with a DC component from one circuit to another, said signal path including a capacitor network for coupling said audio signal from said one circuit to said circuit while blocking said DC component, said network including an inductor connected in series with an aluminum electrolytic capacitor having a relatively high capacitance and an inherent inductance degrading the response of said aluminum capacitor above a certain frequency, said network further including a bypass capacitor of relatively small capacitance and relatively better high frequency performance compared to said aluminum electrolytic capacitor, said inductor having an inductance which substantially decouples said aluminum electrolytic capacitor from said network above a selected frequency so that said bypass capacitor dominates the characteristics of said network above said selected frequency, said inductor, aluminum electrolytic capacitor, and bypass capacitor having values which provide that all frequencies of said audio signal are passed as free of attenuation and distortion as possible.

4. Apparatus according to claim 3 further including a resistor connected in parallel with said inductor, said resistor having a resistance which minimizes resonance effects in said network.

5. A capacitor network comprising;

an inductor;

an aluminum electrolytic capacitor having a relatively high capacitance and a relatively high inherent inductance, said aluminum electrolytic capacitor connected in series with said inductor;

a bypass capacitor connected to bypass said inductor and aluminum electrolytic capacitor, said bypass capacitor having relatively lower capacitance than said aluminum electrolytic capacitor and having a relatively better high frequency performance; and
said inductor having an inductance which substantially decouples said aluminum electrolytic capacitor from said network above a selected frequency so that said bypass capacitor dominates the characteristics of said network above said frequency.

6. A signal coupling/DC blocking capacitor network, comprising:

an inductor;

an aluminum electrolytic capacitor having a relatively high capacitance and a relatively high inherent inductance, said aluminum electrolytic capacitor connected in series with said inductor;

a bypass capacitor connected by bypass said inductor and aluminum electrolytic capacitor, said bypass capacitor having relatively lower capacitance than said aluminum electrolytic capacitor and having a relatively better high frequency performance;

said inductor having an inductance which substantially decouples said aluminum electrolytic capacitor from said network above a selected frequency so that said bypass capacitor dominates the characteristics of said network above said frequency;

means for connecting one end of said network to an audio signal with a DC component so that said audio signal is coupled through to the other end of said network while said DC component is blocked; and said inductor, aluminum electrolytic capacitor, and bypass capacitor having values which provide that all frequencies of said audio signal are passed as free of attenuation and distortion as possible.

* * * * *

UNITED STATES PATENT AND TRADEMARK OFFICE
CERTIFICATE OF CORRECTION

PATENT NO.   : 5,036,292
DATED        : July 30, 1991
INVENTOR(S)  : Hjelm, et al.

It is certified that error appears in the above-identified patent and that said Letters Patent is hereby corrected as shown below:

In Column 2, Line 44, after the word "having" delete the word "a".

In Column 3, Line 67, after the word "networks" delete the word "a".

In Column 4, Line 4, delete the word "claim" and insert therein --claims--.

In Column 5, Line 18, delete the word "by" and insert therein --to--.

Signed and Sealed this

Seventh Day of September, 1993

Attest:

BRUCE LEHMAN

*Attesting Officer*   *Commissioner of Patents and Trademarks*